United States Patent [19]

Thornton et al.

[11] Patent Number: 5,256,339
[45] Date of Patent: Oct. 26, 1993

[54] FABRICATION TECHNIQUE FOR SILICON MICROCLUSTERS USING PULSED ELECTRICAL POWER

[75] Inventors: Clarence G. Thornton, Colts Neck; James F. Harvey, Tinton Falls; Robert A. Lux, Toms River; Robert J. Zeto, Eatontown; Hardev Singh, Robbinsville; Maurice Weiner; Terence Burke, both of Ocean; Lawrence E. Kingsley, Shrewsbury, all of N.J.

[73] Assignee: The United States of America as represented by the Secretary of the Army, Washington, D.C.

[21] Appl. No.: 968,882

[22] Filed: Oct. 30, 1992

[51] Int. Cl.$^5$ ................................. B29C 9/00
[52] U.S. Cl. ...................................... 264/10
[58] Field of Search ................. 264/5, 10; 75/336

[56] References Cited

U.S. PATENT DOCUMENTS 4,610,718 9/1986 Araya et al. .......................... 264/10
4,689,075 8/1987 Uda et al. ............................. 264/10
5,062,936 11/1991 Beaty et al. ........................... 75/336

OTHER PUBLICATIONS

The Condensed Chemical Dictionary, 10th ed., Hawley 1981, pp. 914–915.

Primary Examiner—Mary Lynn Theisen
Attorney, Agent, or Firm—Michael Zelenka; William H. Anderson

[57] ABSTRACT

The present invention describes a method of explosively vaporizing a piece of semiconductor material in a plasma formed by a fast, high voltage current pulse. The semiconductor material may be formed from crystalline, polycrystalline, or amorphous forms of semiconductor material. After the semiconductor material is vaporized, it coalesces as the plasma begins to cool and is deposited in a collection system. The size and composition of the microparticles formed by this process can be controlled by conditioning the plasma in predetermined manners. In particular, impurities can be introduced either in the target material, in gas introduced in the plasma, or in the gas through which the coalescing microparticles travel prior to deposition.

4 Claims, 3 Drawing Sheets

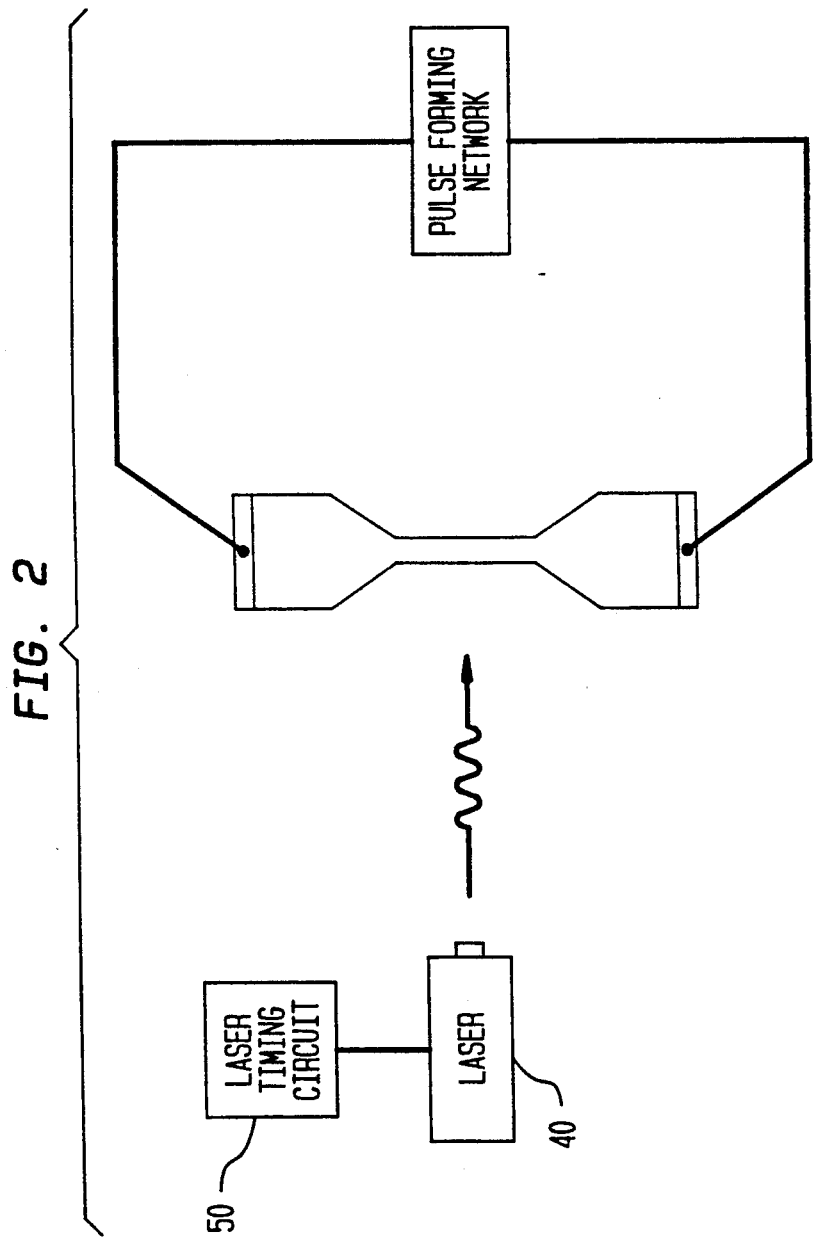

FABRICATION TECHNIQUE FOR SILICON MICROCLUSTERS USING PULSED ELECTRICAL POWER

GOVERNMENT INTEREST

The invention described herein may be manufactured, used and/or licensed by, or on behalf of, the U.S. Government without the payment to us on any royalties thereon.

FIELD OF THE INVENTION

The present invention relates generally to methods of fabricating microclusters and/or microparticles and more particularly relates to methods of fabricating silicon microparticles by explosively vaporizing bulk silicon with pulse power systems.

BACKGROUND OF THE INVENTION

As was recently described in articles such as, "Silicon Quantum Wire Array Fabrication by Electrochemical and Chemical Dissolution of Wafers," L. T. Canham, Appl. Phy. Lett., V. 57. pg. 1046 (1990) and "Resonant Tunneling v a Microcrystalline-Silicon Quantum Confinement," Q. Ye et al, Phys. Rev. B44, pg. 1806 (1991), porous silicon as well as nanometer scale clusters of other semi-conducting materials exhibit bright photoluminescence at room temperature and resonant tunneling and coulomb blockade effects in the electrical transport. In these articles, it is theorized that these materials exhibit these qualities because they have discrete electronic energy spectrums in contrast to the continuous energy bands exhibited by bulk samples of the same materials. Therefore, quantum confined microclusters and/or microparticles of silicon and other semiconducting materials offer the possibility for novel high performance electronic devices which are compatible with established silicon based technologies.

In the above cited articles, the silicon microclusters were formed by two distinct fabrication techniques. These techniques may be briefly described as electrochemically etching silicon wafers to form porous silicon and as recrystallizing silicon microparticle films. Both of these techniques, however, involve chemical processes that are not easily controlled and only produce microparticles of silicon which are embedded in bulk material.

Other gas phase chemical processes for producing independent silicon microparticles have been reported in such articles as, "Above-band-gap photoluminescence from Si fine particles with oxide shell," H. Morisak et al, J. Appl. Phys., 70, pg. 1869 (1991). However, the photoluminescence generated from microparticles produced using this reported method has been very weak as compared with the photoluminescence from porous silicon.

Accordingly, an objective of the present invention is to provide a method of forming independent microparticles and/or microclusters of semiconductive materials.

Another objective of the present invention is to provide such a method wherein dopants can be added to the microparticles during their formation.

Still another objective of the present invention is to provide further control of the formation of the microparticles so as to be able to optimize the size, structure and composition of the microparticles.

These and other objectives are accomplished by explosively vaporizing a piece of semiconductor material formed by a fast, high voltage current pulse. The semiconductor material may be formed from crystalline, polycrystalline, or amorphous forms of semiconductor material. After the semiconductor material is vaporized, it coalesces as the plasma begins to cool and is deposited in a collection system. The size and composition of the microparticles formed by this process can be controlled by conditioning the plasma in predetermined manners. In particular, impurities can be introduced either in the target material, in the gas introduced in the plasma, or in the gas through which the coalescing microparticles travel prior to deposition.

Alternative embodiments of this technique include varying configurations and compositions of the semiconductor material itself. The target materials may be doped or impregnated with impurities to control the chemistry or electrical characteristics of the target. The target material size, pattern and shape may also be altered to control the plasma characteristics. Some alternate patterns and shapes of the target material are shown in FIGS. 3 and 4.

In another embodiment of the invention a laser is utilized to irradiate the target material, causing photoconductivity by the production of electron-hole pairs within the target material. This provides an addition temporal control of the conduction process and hence the plasma formation process.

The present fabrication technique provides a method for producing independent silicon microparticles and films of silicon microparticles without a dependence on chemical processes. As a result, greater flexibility exists for controlling the surface structure of the microparticles. The surface could pure silicon atoms or a chemical surface termination could deliberately introduced via the environmental gas. Chemical dopants could also be deliberately introduced in a similar manner. Such a fabrication technique, therefore, provides for additional flexibility in optimizing the photoluminescence qualities of the microparticles.

BRIEF DESCRIPTION OF THE DRAWINGS

FIG. 2 is a partial schematic illustration of another embodiment of the present invention.

DETAILED DESCRIPTION OF THE INVENTION

Figure 1:
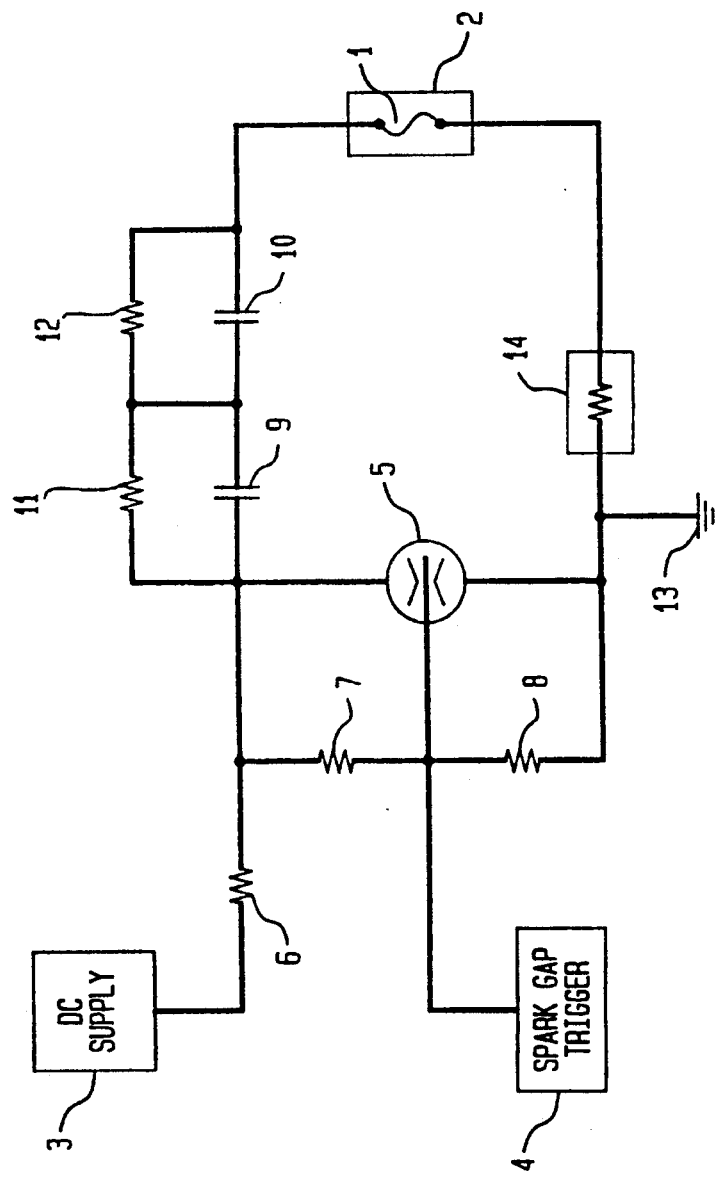
FIG. 1 is a schematic illustration of a pulser circuit which may be utilized in one embodiment of the invention.

The present invention provides for a method of forming microparticles of semiconductor material by explosively vaporizing a target sample 1 of semiconductor material in a plasma formed by a fast, high voltage current pulse. An example of a pulse power network which can provide for such a fast, high voltage current pulse is schematically illustrated in FIG. 1. As shown, the pulse forming network consists of a high voltage power supply 3; a charging resistor (5 MΩ) 6 which is provided to protect the power supply; two capacitors 9 and 10 with a combined capacitance of approximately 0.43 μF; two bleeder resistors 11 and 12 connected across capacitors 9 and 10, respectively; a resistor ladder; a spark gap 5; a spark gap trigger 4; and a ground 13. In operation, power supply 3 charges capacitors 9 and 10 while the mid plane of spark gap 5 is held at half the charging voltage by the resistor ladder which is formed from resistors 7 and 8 (40 MΩ). Therefore, when spark gap trigger 4 applies a fast, high voltage pulse to spark gap 5, spark gap 5 fires and capacitors 9 and 10 discharge. The current discharged by capacitors 9 and 10 may then directed through a target sample 1 to ground 13. The current which passes through the target sample 1 may then be monitored by current viewing resistor 14.

As may be appreciated by those skilled in the art, the above description is merely an example of one pulse forming network. There are many possible circuit configurations for the pulse forming network and as such, those skilled in the art would be able to engineer any number of pulse forming networks to produce the necessary current pulse.

The manner in which the target sample will explosively vaporize will depend on a number of factors. These include target sample size, shape, and conductivity as well as pulse duration and voltage. Therefore, the target sample is preferably of nominal resistance, for example 5 ohms, and should be of a nominal size, for example 14mm×1mm×0.1mm. Likewise, the pulse durationis preferably very fast, for example 3 microseconds, and the voltage should be very high, for example 50 kilovolts.

The sample chamber 2 preferably consists of a chamber capable of maintaining a controlled atmospheric environment for the target sample and a means of entry for at least two electrical connections so the target sample may be electrically connected to the pulse forming network. Because the photoluminescent qualities of the resultant microparticles is a function of the impurities found in the microparticles and the bulk composition of the surface chemistry of the microparticles, it is important to control the atmosphere in the sample chamber. Therefore, in order to control the atmosphere, a series of vacuum pumps may be added to the chamber as well as accompanying vents. Likewise, in order to control the composition of the atmosphere within the sample chamber various intake vents coupled to gas sources may also added to the chamber housing.

Figure 4:
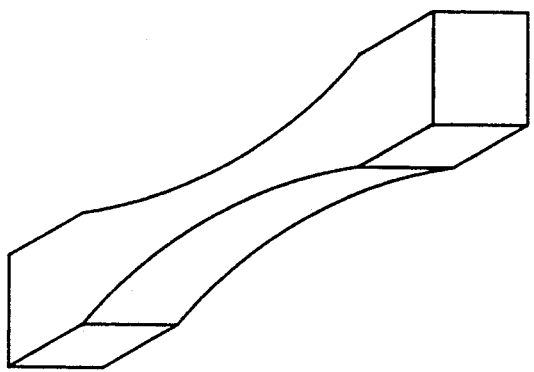
FIGS. 3 and 4 are perspective illustrations of various configurations of the target material.
Figure 3:
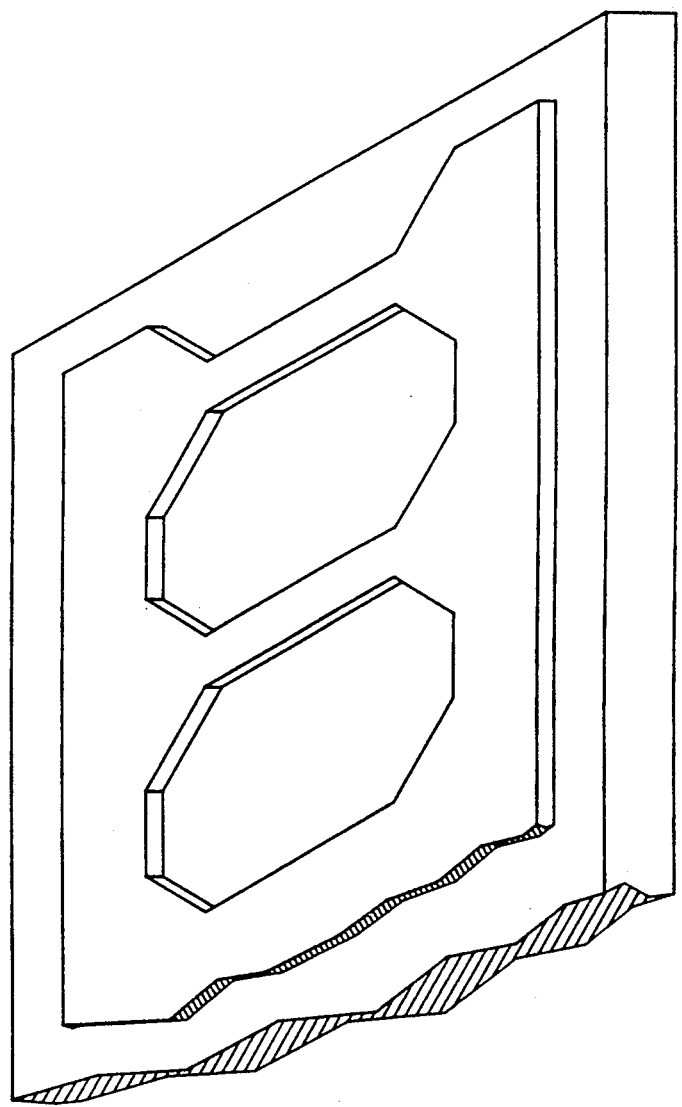

In a more specific embodiment of the present invention, the size and composition of the target sample may be varied in a predetermined manner to control the plasma characteristics. For example, the target sample may be made from crystalline, polycrystalline, amorphous and/or molten semiconductive material. Further, the target sample may be doped or impregnated with impurities to control the chemistry or electrical characteristics of the plasma. Furthermore, the shape of the target sample may also be varied. The various patterns of the target sample can be large scale pattern etched lithographically in thick layers of bulk material or in thin layers mounted on a substrate. Examples of some patterns which have been contemplated by the inventors are illustrated in FIGS. 3 and 4. Further similar variations, however, would be readily apparent to those skilled in the art given the present description. As a result, the details of doping the target material and varying the size and shape of the material need not described in any further detail.

In another embodiment of the invention, the target sample is irradiated with light to form electron-hole pairs within the semiconductive material thus making the target sample more conductive. Therefore, by controlling the conductivity of the target sample, one will be able to control the temporal element of plasma formation. Any number of configurations may be used to irradiate the target sample. An example of one method, however, is shown in FIG. 2.

As shown, a laser 40 is directed at the face portion of the target sample. A timing circuit 50 is then connected to the laser and the circuit will activate the laser at a predetermined time in the pulse formation.

Although the present invention has been described and illustrated in some detail, it is to be understood that the same is made by way of illustration and example only and is not to be taken by way of limitation, the spirit and scope of this invention being limited only by the terms of the appended claims.

What is claimed is:

1. A method of forming microparticles from bulk samples of semiconductive material comprising the steps of:
   a. forming a pulse forming network capable of generating a fast, high voltage pulse;
   b. electrically connecting a target sample of bulk semiconductive material to the pulse forming network;
   c. irradiating the target sample with a predetermined intensity and wavelength of laser light so as to increase the conductivity of the target sample;
   d. explosively vaporizing the target sample into a plasma by passing the fast, high voltage pulse through the target sample; and
   e. collecting microparticles of the target sample as the plasma cools.

2. The method of claim 1 wherein the target sample is explosively vaporized in a sample chamber.

3. The method of claim 2 wherein the sample chamber has an atmosphere of a predetermined composition.

4. The method of claim 1 further comprising the step of doping the target sample to a predetermined composition.

* * * * *